United States Patent
Liu et al.

(10) Patent No.: US 11,955,383 B2
(45) Date of Patent: Apr. 9, 2024

(54) SEMICONDUCTOR DEVICE AND MANUFACTURING METHOD THEREOF

(71) Applicant: CHANGXIN MEMORY TECHNOLOGIES, INC., Hefei (CN)

(72) Inventors: Jie Liu, Hefei (CN); Bin Yang, Hefei (CN); Zhan Ying, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 271 days.

(21) Appl. No.: 17/453,851

(22) Filed: Nov. 7, 2021

(65) Prior Publication Data

US 2023/0005790 A1 Jan. 5, 2023

Related U.S. Application Data

(63) Continuation of application No. PCT/CN2021/106487, filed on Jul. 15, 2021.

(30) Foreign Application Priority Data

Jul. 1, 2021 (CN) .......................... 202110743999.9

(51) Int. Cl.
*H01L 23/49* (2006.01)
*H01L 21/768* (2006.01)
*H01L 23/48* (2006.01)

(52) U.S. Cl.
CPC .. *H01L 21/76898* (2013.01); *H01L 21/76816* (2013.01); *H01L 21/76846* (2013.01); *H01L 23/481* (2013.01)

(58) Field of Classification Search
CPC ......... H01L 21/76898; H01L 21/76816; H01L 21/76846; H01L 23/481
See application file for complete search history.

(56) References Cited

U.S. PATENT DOCUMENTS

| | | | |
|---|---|---|---|
| 8,304,863 B2 | 11/2012 | Filippi | |
| 8,859,425 B2 | 10/2014 | Kirby et al. | |
| 9,153,558 B2 | 10/2015 | Filippi | |
| 9,449,906 B2 | 9/2016 | Kirby et al. | |
| 2011/0193199 A1 | 8/2011 | Filippi | |
| 2012/0292763 A1 | 11/2012 | Filippi | |
| 2014/0103520 A1 | 4/2014 | Kirby et al. | |

(Continued)

FOREIGN PATENT DOCUMENTS

| | | | |
|---|---|---|---|
| CN | 102208362 A | 10/2011 | |
| CN | 102315183 A | 5/2014 | |

(Continued)

*Primary Examiner* — Victor A Mandala
*Assistant Examiner* — Colleen E Snow
(74) *Attorney, Agent, or Firm* — Syncoda LLC; Feng Ma

(57) ABSTRACT

A semiconductor device manufacturing method includes: providing a semiconductor base; patterning the first medium layer to form a groove extending along the base in the base; forming a first auxiliary layer and a first metal layer sequentially in the groove, where the first metal layer is located on the side of the first auxiliary layer towards the first medium layer; thinning the base on the second surface of the base to expose the first auxiliary layer; removing the first auxiliary layer to form a first opening; and forming a second metal layer on the second surface of the base, where the second metal layer fills the first opening.

9 Claims, 11 Drawing Sheets

(56) References Cited

U.S. PATENT DOCUMENTS

2015/0028476 A1 1/2015 Kirby et al.
2020/0335428 A1* 10/2020 Chen ................. H01L 21/76831

FOREIGN PATENT DOCUMENTS

| CN | 104576507 A | 4/2015 |
| CN | 104752324 A | 7/2015 |
| CN | 104854694 A | 8/2015 |

* cited by examiner

SEMICONDUCTOR DEVICE AND MANUFACTURING METHOD THEREOF

CROSS-REFERENCE TO RELATED APPLICATIONS

This is continuation of International Application No. PCT/CN2021/106487 filed on Jul. 15, 2021, which claims priority to Chinese Patent Application No. 202110743999.9 filed on Jul. 1, 2021. The disclosures of both of the above-referenced applications are hereby incorporated by reference in their entirety.

BACKGROUND

Through-Silicon Vias (TSV) technologies can achieve the interconnection with the shortest distance and the smallest spacing between chips, so as to achieve better electrical performance.

SUMMARY

This disclosure relates to the technical field of integrated circuit manufacturing, and in particular to a semiconductor device and a manufacturing method thereof.

In the first aspect, the disclosure provides a manufacturing method of a semiconductor device, which includes the following operations.

A semiconductor base is provided, where a first medium layer is formed on a first surface of the base.

The first medium layer is patterned to form a groove extending along the base in the base.

A first auxiliary layer and a first metal layer are formed sequentially in the groove, where the first metal layer is located on the side of the first auxiliary layer towards the first medium layer.

The base is thinned on the second surface of the base to expose the first auxiliary layer.

The first auxiliary layer is removed to form a first opening.

A second metal layer is formed on the second surface of the base, where the second metal layer fills the first opening.

In the second aspect, the embodiments of the disclosure further provide a semiconductor device, which includes a substrate, a first medium layer and a groove.

The substrate has a first surface and a second surface.

The first medium layer is located on a first surface of the substrate.

The groove is formed in the first medium layer and penetrates the substrate. A metal layer is formed in the groove. The metal layer includes a first metal layer and a second metal layer formed on the first metal layer. The first metal layer fills the first end of the groove close to the first medium layer. The first metal layer has a first height, the second metal layer has a second height, and the first height is greater than the second height.

DETAILED DESCRIPTION

Figure 1:
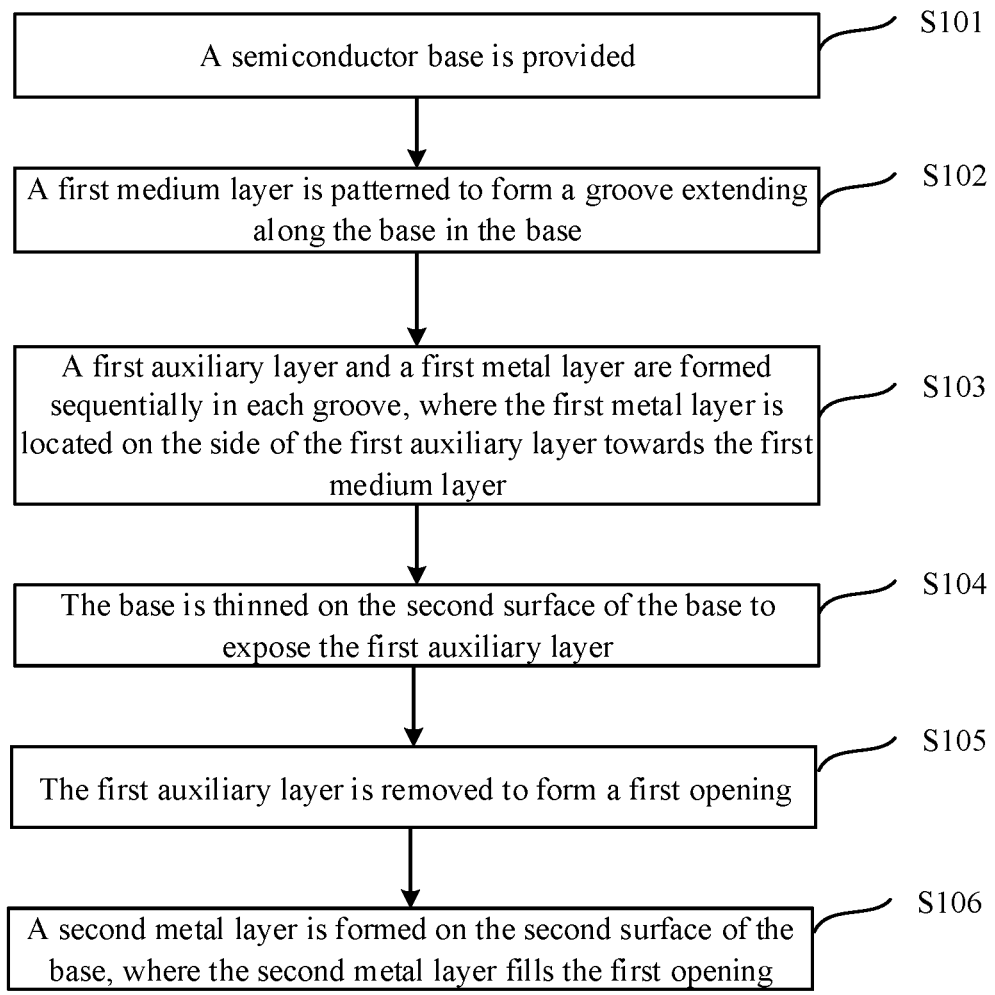
FIG. 1 illustrates a flowchart of a manufacturing method of a semiconductor device provided by an embodiment of the disclosure.

The disclosure will be further described in detail below in combination with the accompanying drawings. Obviously, the described embodiments are only a part of the embodiments of the disclosure, but not all of them. Based on the embodiments in the disclosure, all other embodiments obtained by those skilled in the art without any creative effort shall fall within the protection scope of the disclosure.

In the embodiments of the disclosure, the term "exemplary" is used to mean "serving as an example, embodiment, or illustration". Any embodiment described as "exemplary" need not be construed as being superior or better than other embodiments.

The terms "first" and "second" in the text cannot be understood as indicating or implying relative importance or implicitly indicating the number of indicated technical features, but are only used for descriptive objectives. Thus, the features defining "first" and "second" may explicitly or implicitly include one or more of the features. In the description of the embodiments of the disclosure, unless otherwise specified, "multiple" means two or more.

Hereinafter, some terms in the embodiments of the disclosure will be explained to facilitate the understanding of those skilled in the art.

(1) High selectivity ratio: selectivity ratio refers to the how much faster the etching rate of a material is compared to another material under the same etching conditions, which is defined as the ratio of the etching rate of the etched material to that of another material. High selectivity means that only the layer of material, which is desired to be etched, is etched. A high-selectivity etching process does not etch the lower layer of material (the etching stops when the etching reaches the appropriate depth) and the protective photoresist is not etched.

(2) Annealing: annealing is a metal thermal treatment process, which refers to slowly heating the metal to a certain temperature, keeping the temperature for enough time, and then cooling the metal at an appropriate speed. The objective is to reduce hardness, improving machinability; reduce residual stress, stabilizing size and reducing the deformation and crack tendency; refine grain and adjust structure, eliminating structure defects. To be precise, annealing is a heat treatment process for materials, including metal materials and non-metal materials.

(3) Thermal expansion coefficient: the object expands and contracts due to temperature changes. Its change ability is expressed by the change of the length value caused by the unit temperature change under equal pressure (p is constant), that is, the coefficient of thermal expansion. The thermal expansion coefficient of each object is different, and the unit of thermal expansion coefficient of general metal is 1/degree (Celsius).

In a process of manufacturing TSV, it is usually necessary to grind until the copper layer is exposed. In this process, both silicon and copper materials need to be ground simultaneously. Nevertheless, the material of silicon is relatively fragile and is prone to crack. However, under the conditions of high temperature and electric field, copper can easily diffuse into the semiconductor silicon wafer, and the phenomenon of copper contamination to the surface or cracks of the nearby silicon layer is likely to occur, resulting in low yield.

Various embodiments of the present disclosure provide a semiconductor device and a manufacturing method thereof, which avoids copper contamination on the surface of the side silicon layer or cracks in the process of manufacturing TSV, resulting in low yield. The method includes: providing a semiconductor base, where a first medium layer is formed on a first surface; patterning the first medium layer to form a groove extending along the base in the base; forming a first auxiliary layer and a first metal layer sequentially in the groove, where the first metal layer is located on the side of the first auxiliary layer towards the first medium layer; thinning the base on the second surface of the base to expose the first auxiliary layer; removing the first auxiliary layer to form a first opening; and forming a second metal layer on the second surface of the base, where the second metal layer fills the first opening. In the method, the first auxiliary layer is first filled at the bottom of the groove after the groove is formed. Since the depth of the groove will not be exactly the same, when thinning of the base is subsequently performed on the second surface of the base until the first auxiliary layer is exposed, the case in which the grinding reaches the substrate and the first metal layer at the same time to cause cracks in the substrate will not occur, which can prevent copper contamination to the surface or cracks of the nearby silicon layer, thereby improving the yield of TSV manufacturing.

FIG. 1 illustrates a flowchart of a manufacturing method of a semiconductor device provided by an embodiment of the disclosure. As shown in FIG. 1, the manufacturing method of a semiconductor device includes the following steps.

At S101, a semiconductor base is provided.

A first medium layer is formed on a first surface of the semiconductor base.

Specifically, the semiconductor base includes a substrate and a first medium layer on the front face of the base. The substrate has a front face and a back face. A first medium layer is formed on the first surface of the base.

At S102, the first medium layer is patterned to form a groove extending along the base in the base.

Specifically, the first medium layer is patterned to form a groove on the semiconductor base, the groove penetrates the first medium layer and does not extend to the back face of the substrate.

Specifically, the number of grooves may be multiple. During the manufacturing process of the semiconductor device, according to the overall device layout, a required number of grooves can be provided in an appropriate region of the semiconductor device in order to connect to other semiconductor devices, etc.

Figure 2:
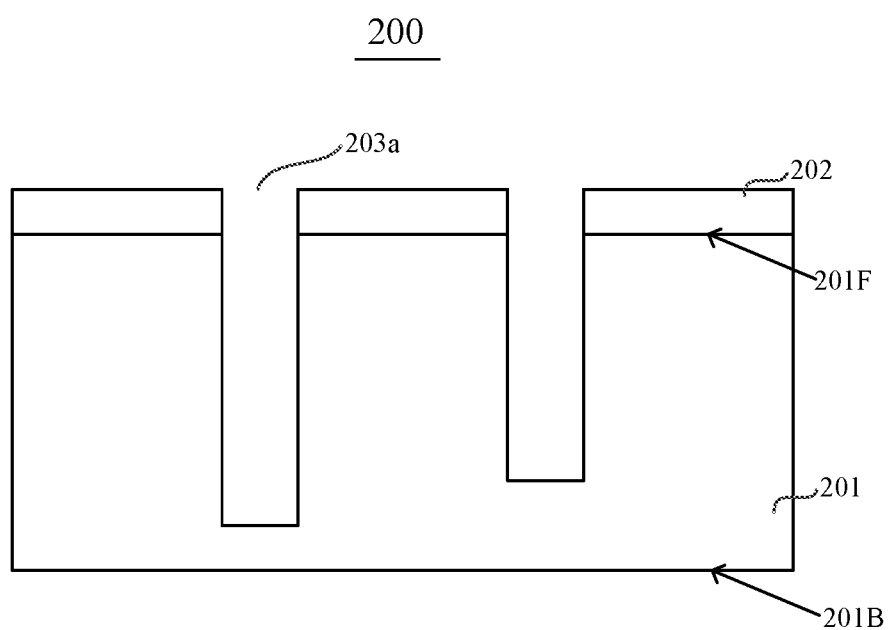
FIG. 2 illustrates a schematic diagram of a semiconductor base and a groove provided by an embodiment of the disclosure.

Exemplarily, as shown in FIG. 2, a semiconductor base 200 is provided. Wherein the semiconductor base 200 includes a base 201 and a first medium layer 202 located on the front side 201F of the base 201. The semiconductor base 200 is provided with a groove 203a. The groove 203a penetrates the first medium layer 202 and does not extend to the back face 201B of the base 201. In FIG. 2, the number of grooves 203a is two, which is only for illustrative purposes and does not limit the disclosure. According to the overall device layout, the required number of grooves can be provided in a suitable region of the semiconductor base 200. The number of grooves may be one or multiple. For example, grooves 203a1, 203a2, . . . , 203aN may be provided to connect to other semiconductor devices. Understandably, limited to the manufacturing process, the depth of the grooves may not be completely the same.

At S103, a first auxiliary layer and a first metal layer are formed sequentially in each groove, wherein the first metal layer is located on the side of the first auxiliary layer towards the first medium layer.

The material of the first auxiliary layer has less ductility than the material of the first metal layer.

Figure 3:
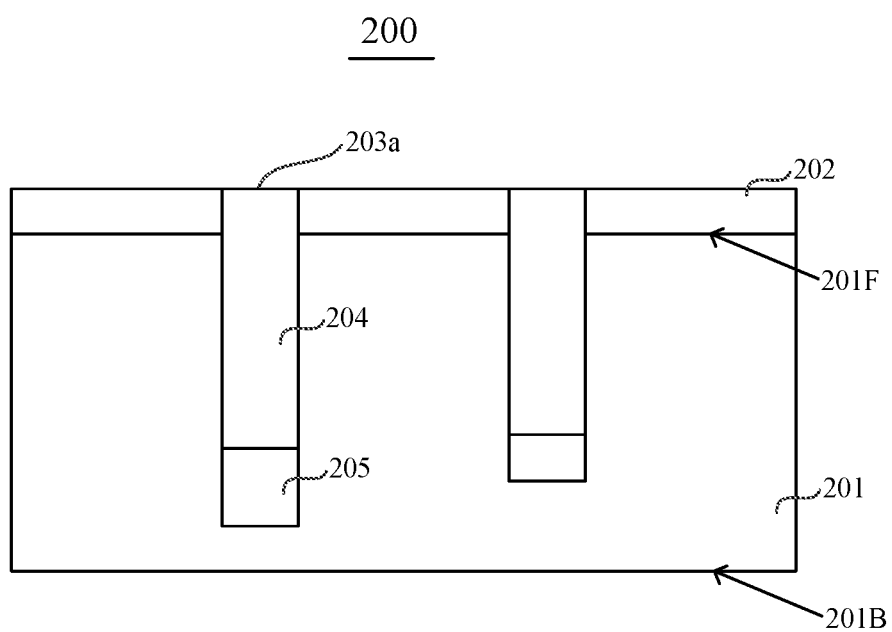
FIG. 3 illustrates a schematic diagram of forming a first auxiliary layer and a first metal layer provided by an embodiment of the disclosure.

Exemplarily, as shown in FIG. 3, a first auxiliary layer 204 and a first metal layer 205 are sequentially formed in each groove 203a, and the first metal layer 204 is located on the side of the first auxiliary layer 205 towards the first medium layer 202.

In a possible implementation manner, the material of the first metal layer is copper.

In a possible implementation manner, the material of the first auxiliary layer is: silicon dioxide, silicon nitride, or a metal whose ductility is less than that of the material of the first metal layer.

At S104, the base is thinned on the second surface of the base to expose the first auxiliary layer.

In specific implementation, the substrate is thinned on the back face of the substrate to expose the first auxiliary layer.

Figure 4:
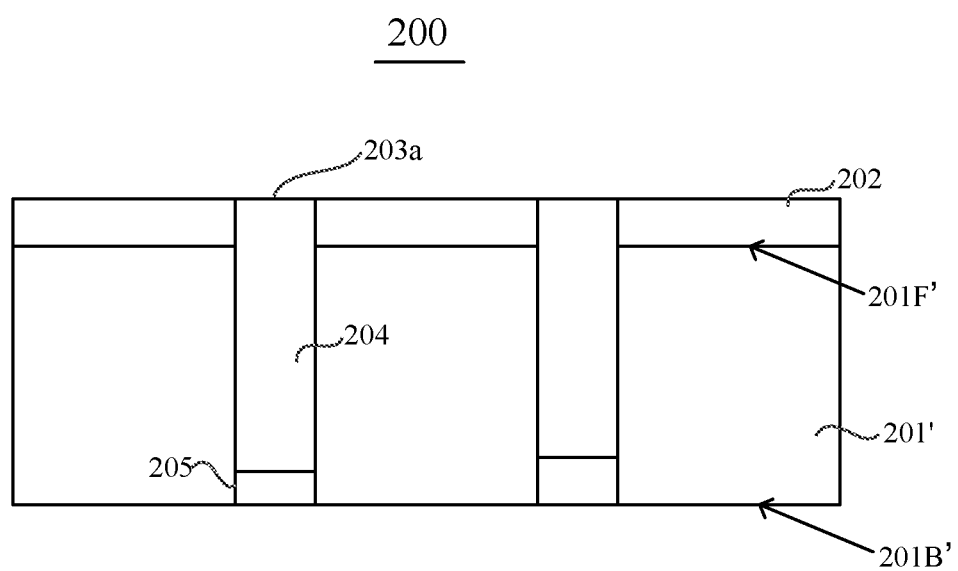
FIG. 4 illustrates a schematic diagram of thinning a base provided by an embodiment of the disclosure.

Exemplarily, as shown in FIG. 4, the substrate 201 is thinned on the back face 201B of the substrate 201 to expose the first auxiliary layer 205, and a thinned substrate 201' is obtained, which has a back face 201B' and front face 201F'. The front face 201F' of the thinned substrate 201' is consistent with the front face 201F of the substrate 201.

At S105, the first auxiliary layer is removed to form a first opening.

During specific implementation, the first auxiliary layer in the groove may be removed by an etching process to form the first opening.

Figure 5:
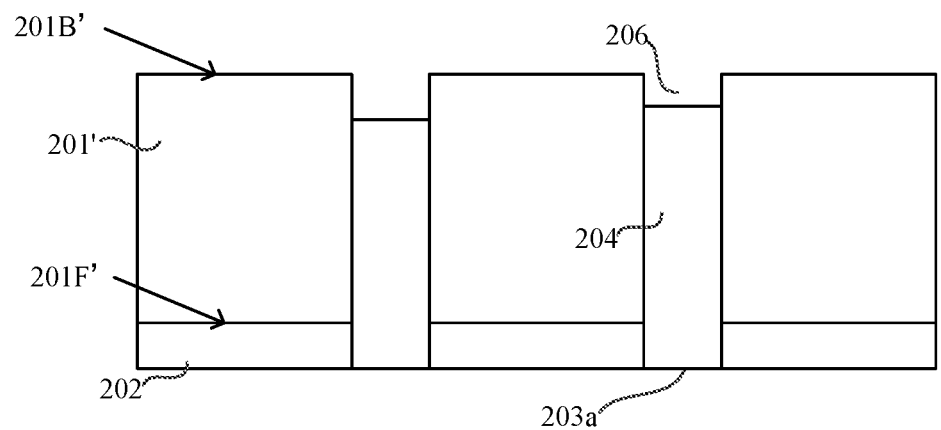
FIG. 5 illustrates a schematic diagram of etching a first auxiliary layer in a groove provided by an embodiment of the disclosure.

Exemplarily, as shown in FIG. 5, the first auxiliary layer 205 in the groove 203a is removed by an etching process to form the first opening 206.

In a possible implementation manner, when the first auxiliary layer in the groove is removed by an etching process, the first auxiliary layer and the substrate have a high selectivity ratio.

At S106, a second metal layer is formed on the second surface of the base, where the second metal layer fills the first opening.

Figure 6:
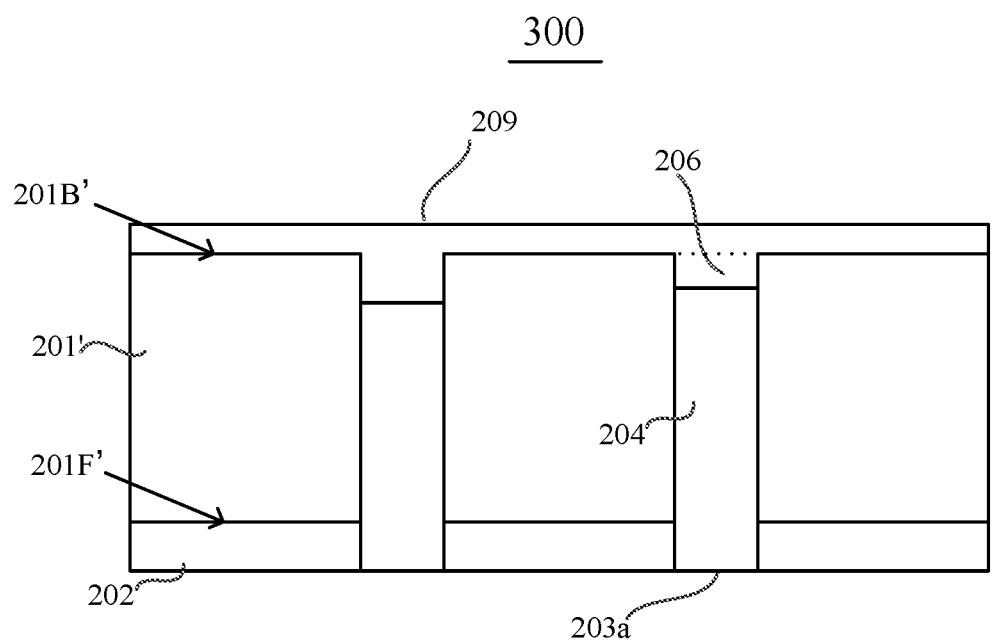
FIG. 6 illustrates a schematic diagram of forming a second metal layer provided by an embodiment of the disclosure.

Exemplarily, as shown in FIG. 6, a second metal layer 209 is formed on the back face 201B' of the substrate 201', and the second metal layer 209 is made to fill the first opening 206.

In a possible implementation manner, the material of the second metal layer is the same as or different from that of the first metal layer.

In a possible implementation manner, the first thermal expansion coefficient of the second metal layer is smaller than the second thermal expansion coefficient of the first metal layer.

In a possible implementation manner, the materials of the second metal layer and the first metal layer are copper; and after the second metal layer is deposited on the second medium layer, the method further includes the following operation.

The second metal layer is annealed.

In a possible implementation manner, the material of the second metal layer is copper; after the second metal layer is deposited on the second medium layer, the second metal layer is annealed.

In a possible implementation manner, there are multiple grooves, and the second metal layer extends to cover each groove.

By the method as shown in FIG. 1, after the groove is formed, the first auxiliary layer fills at the bottom of the groove at first. Since the depth of the groove will not be exactly the same, when thinning of the base is subsequently performed on the second surface of the base until the first auxiliary layer is exposed, the case in which the grinding reaches the substrate and the first metal layer at the same time to cause cracks in the substrate will not occur, which can prevent copper contamination to the surface or cracks of the nearby silicon layer, thereby improving the yield of TSV manufacturing.

Figure 7:
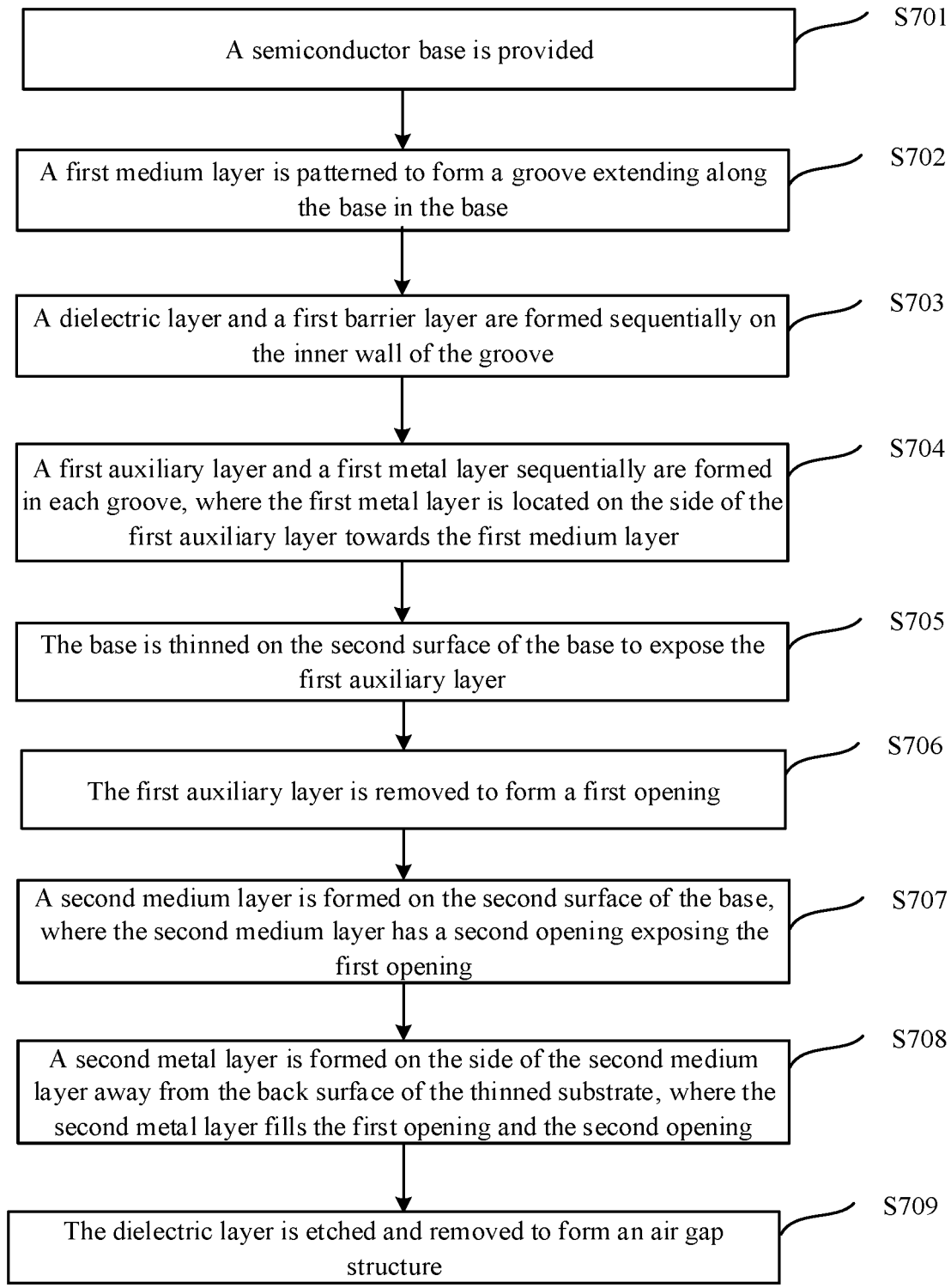
FIG. 7 illustrates a flowchart of a manufacturing method of a semiconductor device provided by an embodiment of the disclosure.

In another embodiment of the disclosure, as shown in FIG. 7, the manufacturing method of a semiconductor device includes the following process steps.

At S701, a semiconductor base is provided.

The semiconductor base includes a substrate and a first medium layer located on the front face of the substrate; a groove is provided on the semiconductor base; the groove penetrates the first medium layer and does not extend to the back face of the substrate.

At S702, the first medium layer is patterned to form a groove extending along the base in the base.

At S703, a dielectric layer and a first barrier layer are sequentially formed on the inner wall of the groove.

The materials of the dielectric layer and the first auxiliary layer may be the same or different.

Specifically, a dielectric layer and a first barrier layer are sequentially deposited on the inner wall of the groove.

Figure 8:
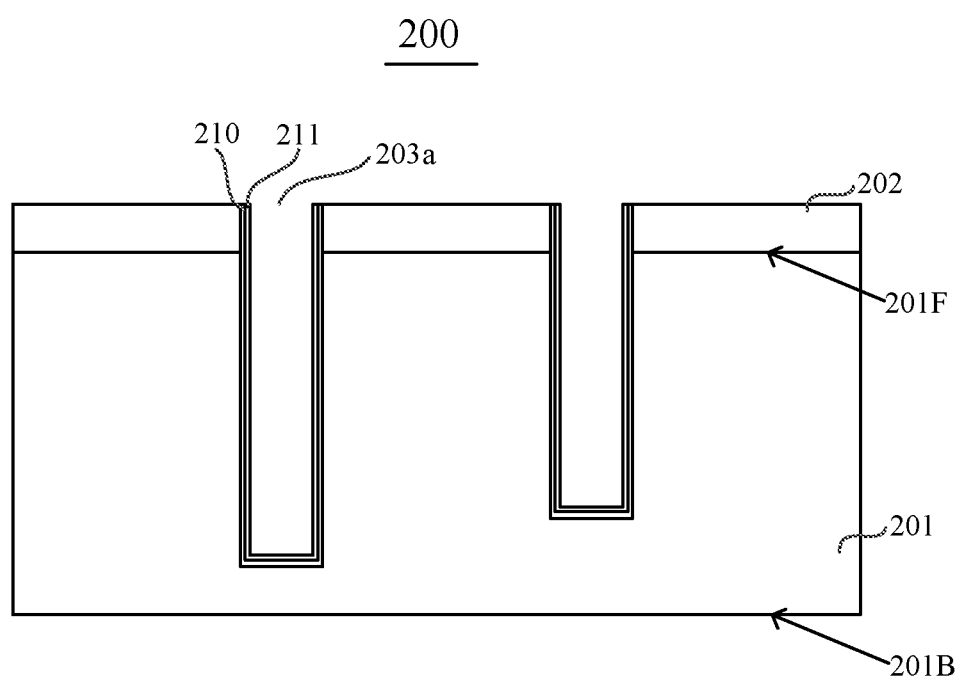
FIG. 8 illustrates a schematic diagram of forming a dielectric layer and a first barrier layer provided by an embodiment of the disclosure.

Exemplarily, as shown in FIG. 8, a dielectric layer 210 and a first barrier layer 211 are sequentially formed on the inner wall of the groove 203a.

In a possible implementation manner, the first medium layer and the dielectric layer have the same material, and the first barrier layer and the second barrier layer have the same material.

In a possible implementation manner, the material of the dielectric layer is silicon nitride, and the material of the first barrier layer is titanium nitride.

At S704, a first auxiliary layer and a first metal layer are sequentially formed in each groove, where the first metal layer is located on the side of the first auxiliary layer towards the first medium layer.

The material of the first auxiliary layer has less ductility than the material of the first metal layer.

At S705, the base is thinned on the second surface of the base to expose the first auxiliary layer.

At S706, the first auxiliary layer is removed to form a first opening.

At S707, a second medium layer is formed on the second surface of the base, where the second medium layer has a second opening, and the second opening exposes the first opening.

Specifically, a second medium layer is formed on the back face of the thinned substrate, and a second opening is formed in the second medium layer.

The second opening exposes the first opening.

Figure 9:
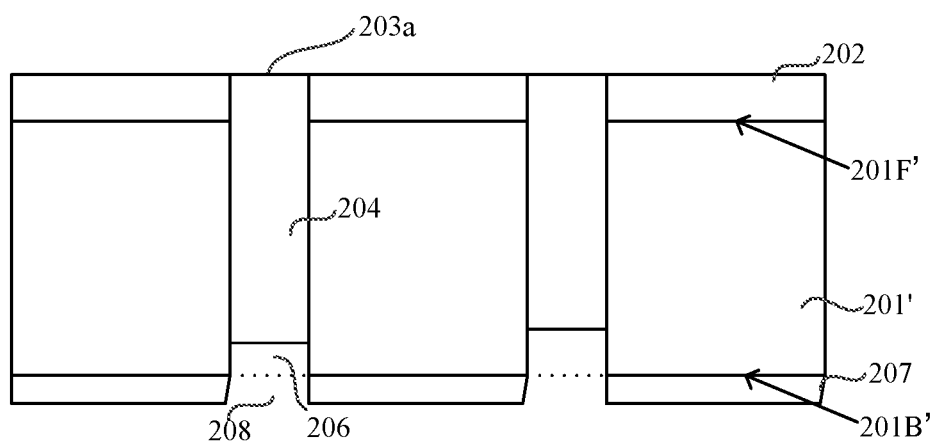
FIG. 9 illustrates a schematic diagram of forming a second medium layer provided by an embodiment of the disclosure.

Exemplarily, as shown in FIG. 9, a second medium layer 207 is formed on the back face 201B' of the thinned substrate 201', and a second opening 208 is formed in the second medium layer 207. The second opening 208 exposes the first opening 206.

In a possible implementation manner, in addition to formation of a second medium layer on the back face of the thinned substrate and formation of a second opening in the second medium layer, a second barrier layer is also formed on the inner wall of the second opening.

The second barrier layer is connected to the first barrier layer.

At S708, a second metal layer is formed on the side of the second medium layer away from the back face of the thinned substrate, where the second metal layer is made to fill the first opening and the second opening.

At S709, the dielectric layer is etched and removed to form an air gap structure.

Specifically, the dielectric layer is etched away in each groove to form an air gap structure, where the air gap structure is a gap between the first barrier layer and the inner wall of the groove.

Figure 10:
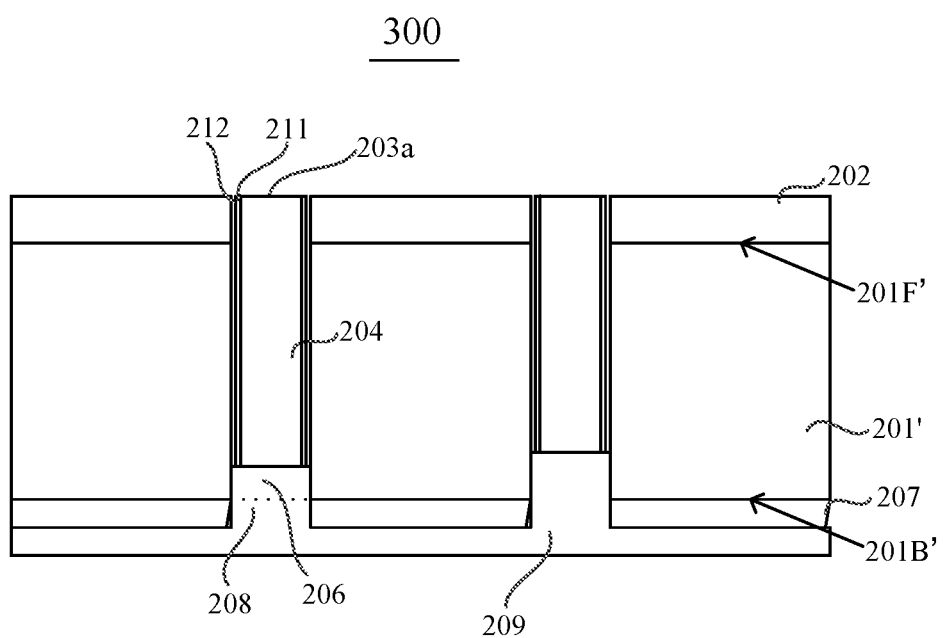
FIG. 10 illustrates a schematic diagram of forming an air gap structure provided by an embodiment of the disclosure.

Exemplarily, as shown in FIG. 10, the dielectric layer is etched away in each groove to form an air gap structure 212, where the air gap structure 212 is a gap between the first barrier layer 211 and the inner wall of the groove 203a.

In a possible implementation manner, after the air gap structure is formed, the method further includes the following operation.

The second metal layer is annealed.

The manufacturing method of a semiconductor device shown in FIG. 7 includes: a dielectric layer and a first barrier layer are formed sequentially on the inner wall of the groove; the dielectric layer is etched to form an air gap structure that is a gap between the first barrier layer and the inner wall of the groove. In this method, by providing a dielectric layer, an air gap structure can be formed. The air gap structure provides a gap between the substrate and the conductive metal layer in the barrier layer. This can reduce the thermal stress caused by the thermal expansion coefficient mismatch between the substrate and the conductive metal layer in the barrier layer; at the same time, the first barrier layer can also provide a buffer barrier for the substrate during polishing, reduce the probability of cracks in the silicon layer, and prevent copper contamination to the surface or cracks of the side silicon layer, thereby further improving the yield of TSV manufacturing.

In another embodiment, the etching and removing of the dielectric layer to form an air gap structure is specifically implemented in the following manner.

The dielectric layer in the first medium layer and the groove are etched and removed.

A third medium layer is rapidly deposited on the first surface of the base to form the air gap structure in the groove.

In another embodiment, the third medium layer covers the sidewall of the first metal layer on the first surface and exposes the top surface of the first metal layer.

Figure 11:
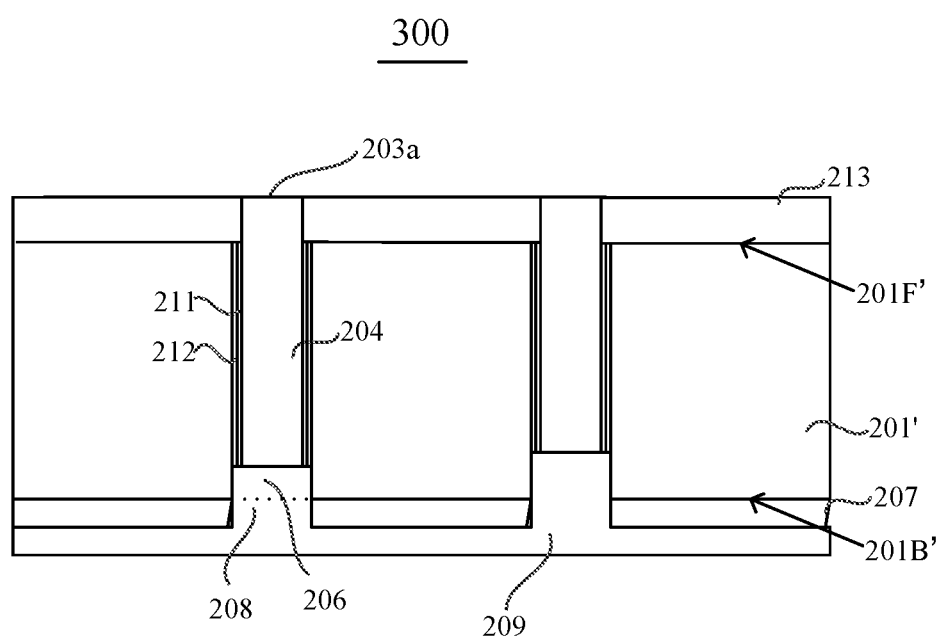
FIG. 11 illustrates a schematic diagram of forming a third medium layer provided by an embodiment of the disclosure.

Exemplarily, as shown in FIG. 11, the dielectric layer is etched and removed to form an air gap structure, which is specifically achieved by the following manner: the first medium layer 202 and the dielectric layer 210 in the groove 203a are etched away;

A third medium layer 213 is rapidly deposited on the front face 201F' of the thinned substrate 201' to form an air gap structure 212 in the groove 203a.

The third medium layer 213 covers the sidewall of the first metal layer 204 on the front surface 201F' of the thinned substrate 201' and exposes the top surface of the first metal layer 204.

Based on the same inventive concept, as shown in FIG. 6, the disclosure provides a semiconductor device 300, which includes a substrate 201', a first medium layer 202 and a groove 203a.

The substrate 201' has a front face 201F' and a back face 201B'.

The first medium layer is 202 located on the front face 201F' of the substrate 201'.

The groove 203a is formed in the first medium layer 202 and penetrates the substrate 201'. A metal layer is formed in the groove 203a. The metal layer includes a first metal layer 204 and a second metal layer 206 formed on the first metal layer 204. The first metal layer 204 fills the first end of the groove 203a close to the first medium layer 202, the second metal layer 206 fills the second end of the groove 203a away from the first medium layer 202; the first metal layer 204 has a first height, the second metal layer 206 has a second height, and the first height is greater than the second height.

In a possible implementation manner, as shown in FIG. 10, the groove 203a further includes a first barrier layer 211, the first barrier layer 211 is formed between the groove 203a and the metal layer. The metal layer includes a first metal layer 204 and a second metal layer 206 formed on the first metal layer 204. It can be understood that, the first barrier layer 211 may only be in contact with a part of the metal layer, for example, the first metal layer 204.

In a possible implementation manner, as shown in FIG. 10, the groove 203a further includes an air gap structure 212 formed between the groove 203a and the metal layer.

In a possible implementation manner, the second medium layer 207 is further included. As shown in FIG. 10, the second medium layer 207 is formed on the back surface 2013 of the substrate 201', and the second medium layer 207 has an opening exposing the groove 203a, and the second metal layer 207 is simultaneously formed in the opening.

What is claimed is:

1. A manufacturing method of a semiconductor device, comprising:
    providing a semiconductor base, wherein a first medium layer is formed on a first surface of the base;
    patterning the first medium layer to form a groove extending along the base in the base;
    forming a dielectric layer and a first barrier layer sequentially on an inner wall of the groove;
    forming a first auxiliary layer and a first metal layer sequentially in the groove, wherein the first metal layer is located on a side of the first auxiliary layer towards the first medium layer, wherein the materials of the dielectric layer and the first auxiliary layer are the same or different;
    thinning the base on a second surface of the base to expose the first auxiliary layer;
    removing the first auxiliary layer to form a first opening;
    forming a second medium layer on the second surface of the base, wherein the second medium layer has a second opening, and the second opening exposes the first opening;
    forming a second metal layer on the second surface of the base, wherein the second metal layer fills the first opening;
    etching and removing the dielectric layer to form an air gap structure, wherein the air gap structure is a gap between the first barrier layer and the inner wall of the groove;
    wherein etching and removing the dielectric layer to form the air gap structure comprises:
    etching and removing the dielectric layer in the first medium layer and the groove; and
    rapidly depositing a third medium layer on the first surface of the base to form the air gap structure in the groove.

2. The method according to claim 1, wherein the second metal layer is simultaneously formed on the second medium layer and in the second opening, wherein before the second metal layer is formed in the second opening, the method further comprises:
    forming a second barrier layer on a sidewall of the second metal layer.

3. The method according to claim 2, wherein the first medium layer and the dielectric layer have the same material, and the first barrier layer and the second barrier layer have the same material.

4. The method according to claim 2, wherein the materials of the second metal layer and the first metal layer are copper; wherein after depositing the second metal layer on the second medium layer, the method further comprises:
    annealing the second metal layer.

5. The method according to claim 1, wherein the third medium layer covers a sidewall of the first metal layer on the first surface and exposes a top surface of the first metal layer.

6. The method according to claim 1, wherein materials of the second metal layer and the first metal layer are the same or different.

7. A manufacturing method of a semiconductor device, comprising:
    providing a semiconductor base, wherein a first medium layer is formed on a first surface of the base;
    patterning the first medium layer to form a groove extending along the base in the base;
    forming a dielectric layer and a first barrier layer sequentially on an inner wall of the groove;
    forming a first auxiliary layer and a first metal layer sequentially in the groove, wherein the first metal layer is located on a side of the first auxiliary layer towards the first medium layer;
    thinning the base on a second surface of the base to expose the first auxiliary layer;
    removing the first auxiliary layer to form a first opening;
    forming a second medium layer on the second surface of the base, wherein the second medium layer has a second opening, and the second opening exposes the first opening;
    forming a second metal layer on the second surface of the base, wherein the second metal layer fills the first opening;

etching and removing the dielectric layer to form an air gap structure, wherein the air gap structure is a gap between the first barrier layer and the inner wall of the groove; and annealing the second metal layer.

8. A semiconductor device, comprising:

a substrate having a first surface and a second surface;

a first medium layer located on a first surface of the substrate; and a groove formed in the first medium layer and penetrating the substrate, wherein a metal layer is formed in the groove, the metal layer includes a first metal layer and a second metal layer formed on the first metal layer, the first metal layer fills the first end of the groove close to the first medium layer, the first metal layer has a first height, the second metal layer has a second height, and the first height is greater than the second height;

a second medium layer formed on the second surface, wherein the second medium layer has an opening exposing the groove, the second metal layer is simultaneously formed on the second medium layer and in the opening;

wherein the groove further comprises an air gap structure formed between the groove and the metal layer, the air gap structure is formed through rapidly depositing a third medium layer on the first surface of the base.

9. The device according to claim 8, wherein the groove further comprises a barrier layer formed between the groove and the metal layer.

* * * * *